(12) United States Patent
Kuwahara et al.

(10) Patent No.: US 7,902,858 B2
(45) Date of Patent: Mar. 8, 2011

(54) CALIBRATION CIRCUIT, SEMICONDUCTOR DEVICE INCLUDING THE SAME, AND MEMORY MODULE

(75) Inventors: Shunji Kuwahara, Tokyo (JP); Hiroki Fujisawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/216,676

(22) Filed: Jul. 9, 2008

(65) Prior Publication Data

US 2009/0015312 A1    Jan. 15, 2009

(30) Foreign Application Priority Data

Jul. 10, 2007    (JP) .................. 2007-181359

(51) Int. Cl.
*H03K 17/16*    (2006.01)
*H03K 19/003*    (2006.01)
*H03K 5/12*    (2006.01)

(52) U.S. Cl. ............ 326/30; 327/170; 365/189.11

(58) Field of Classification Search ............ 326/30, 326/68, 82, 83, 86, 87; 327/170, 172–176; 365/189.05, 189.11

See application file for complete search history.

(56) References Cited

U.S. PATENT DOCUMENTS

| | | | | |
|---|---|---|---|---|
| 6,839,286 | B2 * | 1/2005 | Cho et al. ............. | 365/189.05 |
| 7,521,957 | B2 * | 4/2009 | Koo .................... | 326/30 |
| 2003/0231523 | A1 * | 12/2003 | Cho et al. ............. | 365/189.05 |
| 2006/0006903 | A1 * | 1/2006 | Choi et al. ............ | 326/30 |
| 2009/0009213 | A1 * | 1/2009 | Osanai et al. ......... | 326/30 |

FOREIGN PATENT DOCUMENTS

| | | |
|---|---|---|
| JP | 2002-152032 | 5/2002 |
| JP | 2004-32070 | 1/2004 |
| JP | 2005-159702 | 6/2005 |
| JP | 2006-203405 | 8/2006 |
| JP | 2007-110615 | 4/2007 |

* cited by examiner

*Primary Examiner* — Vibol Tan
*Assistant Examiner* — Dylan White

(57) ABSTRACT

A calibration circuit includes: a replica buffer that drives a calibration terminal; a pre-emphasis circuit connected in parallel to the replica buffer; and an up-down counter that changes impedances of the replica buffer and the pre-emphasis circuit. A replica control circuit causes the replica buffer to conduct based on an impedance code, and a pre-emphasis control circuit causes the pre-emphasis circuit to conduct in an initial stage of a conducting period of the replica buffer. Thereby, even when an external resistor is shared among a plurality of semiconductor devices, for example, a voltage appearing in the calibration terminal can be stabilized at a higher speed.

17 Claims, 13 Drawing Sheets

CALIBRATION CIRCUIT, SEMICONDUCTOR DEVICE INCLUDING THE SAME, AND MEMORY MODULE

TECHNICAL FIELD

The present invention relates to a calibration circuit and a semiconductor device including the same, and, more particularly relates to a calibration circuit that adjusts an impedance of an output buffer, and a semiconductor device including the same. The present invention also relates to a memory module including the semiconductor device.

In recent years, a significantly high data transfer rate is required for a data transfer between semiconductor devices (between CPUs and memories, for example). To accomplish the high data transfer rate, an amplitude of input/output signals is increasingly reduced. When the amplitude of the input/output signals is reduced, the required accuracy of an impedance to an output buffer becomes very severe.

The impedance of the output buffer varies depending on process conditions during the manufacturing. Also, during its actual use, the impedance of the output buffer is affected by a change in ambient temperature and a variation of a power source voltage. Thus, when high impedance accuracy is required for the output buffer, an output buffer having an impedance adjusting function is adopted (see Japanese Patent Application Laid-open Nos. 2002-152032, 2004-32070, 2006-203405, 2005-159702, and 2007-110615). The adjustment of the impedance of such an output buffer is performed using a circuit generally called a "calibration circuit".

As disclosed in Japanese Patent Application Laid-open Nos. 2006-203405, 2005-159702, and 2007-110615, the calibration circuit includes a replica buffer having a configuration substantially identical to that of the output buffer. When a calibration operation is performed, in a state where an external resistor is connected to a calibration terminal, voltage that appears in the calibration terminal is compared with a reference voltage, thereby adjusting the impedance of the replica buffer. When an adjustment result of the replica buffer is then reflected in the output buffer, the impedance of the output buffer is set to a desired value.

Thus, the calibration terminal needs to be connected with the external resistor. However, when the semiconductor device is packaged on a circuit board with high density, in some cases, there can be a need of sharing the external resistor among a plurality of semiconductor devices. In this case, a capacitive component connected to the calibration terminal increases, and thus, a time constant becomes large. Thereby, an output waveform appearing in the calibration terminal becomes dull. As a result, there arises a problem that the calibration operation requires extra time.

Further, a calibration period during which a calibration operation is performed is generally defined by the number of clock cycles (64 clock cycles, for example), and thus, the higher a frequency of the clock signal, the shorter the calibration period. Thereby, an influence caused due to dulling of the output waveform becomes more apparent when the frequency of the clock is higher.

SUMMARY OF THE INVENTION

The present invention has been achieved to solve such problems, and an object of the present invention is to provide an improved calibration circuit and a semiconductor device including the same.

Another object of the present invention is to provide a calibration circuit capable of stabilizing voltage appearing at a calibration terminal at a higher speed, and a semiconductor device including the same.

Still another object of the present invention is to provide a memory module mounted thereon with the semiconductor device.

A calibration circuit according to the present invention comprises:
a first replica buffer that drives a calibration terminal;
a first pre-emphasis circuit connected in parallel to the first replica buffer;
a control unit that changes an impedance of the first replica buffer based on a voltage appearing at least at the calibration terminal, wherein
the control unit brings the first pre-emphasis circuit into an active state during an initial stage of an active period of the first replica buffer.

A semiconductor device according to the present invention comprises a data output terminal, an output buffer that drives the data output terminal, and said calibration circuit.

A memory module according to the present invention comprises said semiconductor device, a circuit board on which the semiconductor device is mounted, and a resister mounted on the circuit board and connected to the calibration terminal.

According to the present invention, the first pre-emphasis circuit conducts in an initial stage of a conducting period of the first replica buffer, and thus, even when an external resistor is shared among a plurality of semiconductor devices, for example, the voltage appearing in the calibration terminal can be stabilized at a higher speed. Thus, even when a calibration period is short because a frequency of a clock is high, a normal calibration operation can be made.

In the first pre-emphasis circuit, an impedance preferably is variable. In this case, the control unit preferably changes the impedance of the first pre-emphasis circuit in response to the impedance of the first replica buffer. Thereby, an influence of the first pre-emphasis circuit on the first replica buffer can be rendered substantially constant.

A calibration circuit according to the preset invention further includes: a second replica buffer having a circuit configuration substantially identical to that of the first replica buffer; a third replica buffer connected in series to the second replica buffer; and a second pre-emphasis circuit connected in parallel to the third replica buffer. The control unit preferably changes the impedance of the third replica buffer based on the voltage appearing at a contact point between the second replica buffer and the third replica buffer. Thereby, integrities of the first replica buffer and the third replica buffer increase, and thus, a more accurate calibration operation can be performed.

In this case, the second pre-emphasis circuit preferably is held non-conductive at least in a conducting period of the third replica buffer. The reason for this is that, unlike the first replica buffer, the second and third replica buffers are normally not connected to the calibration terminal, and thus, when the second pre-emphasis circuit is operated, a calibration waveform is overshot.

Alternatively, it is also preferable that the calibration circuit further include a dummy capacitance arranged at the contact point between the second replica buffer and the third replica buffer, in which the control unit causes the second pre-emphasis circuit to conduct in an initial stage of the conducting period of the third replica buffer. Preferably, the dummy capacitance has a capacitive value substantially equal to a capacitive component connected to the calibration terminal. Thereby, the integrities of the first replica buffer and the third replica buffer further increase, and thus, a more precise calibration operation can be performed.

In this case, it is preferable that in the second pre-emphasis circuit, the impedance is variable, and the control unit change the impedance of the second pre-emphasis circuit in response to the impedance of the third replica buffer. Thereby, an influence of the second pre-emphasis circuit on the third replica buffer can be rendered substantially constant.

As described above, according to the present invention, a pre-emphasis circuit conducts in an initial stage of a conducting period of a replica buffer, and thus, even when an external resistor is shared among a plurality of semiconductor devices, the voltage appearing in a calibration terminal can be stabilized at a higher speed. Therefore, even when a calibration period is short because a frequency of a clock is high, a normal calibration operation can be performed.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
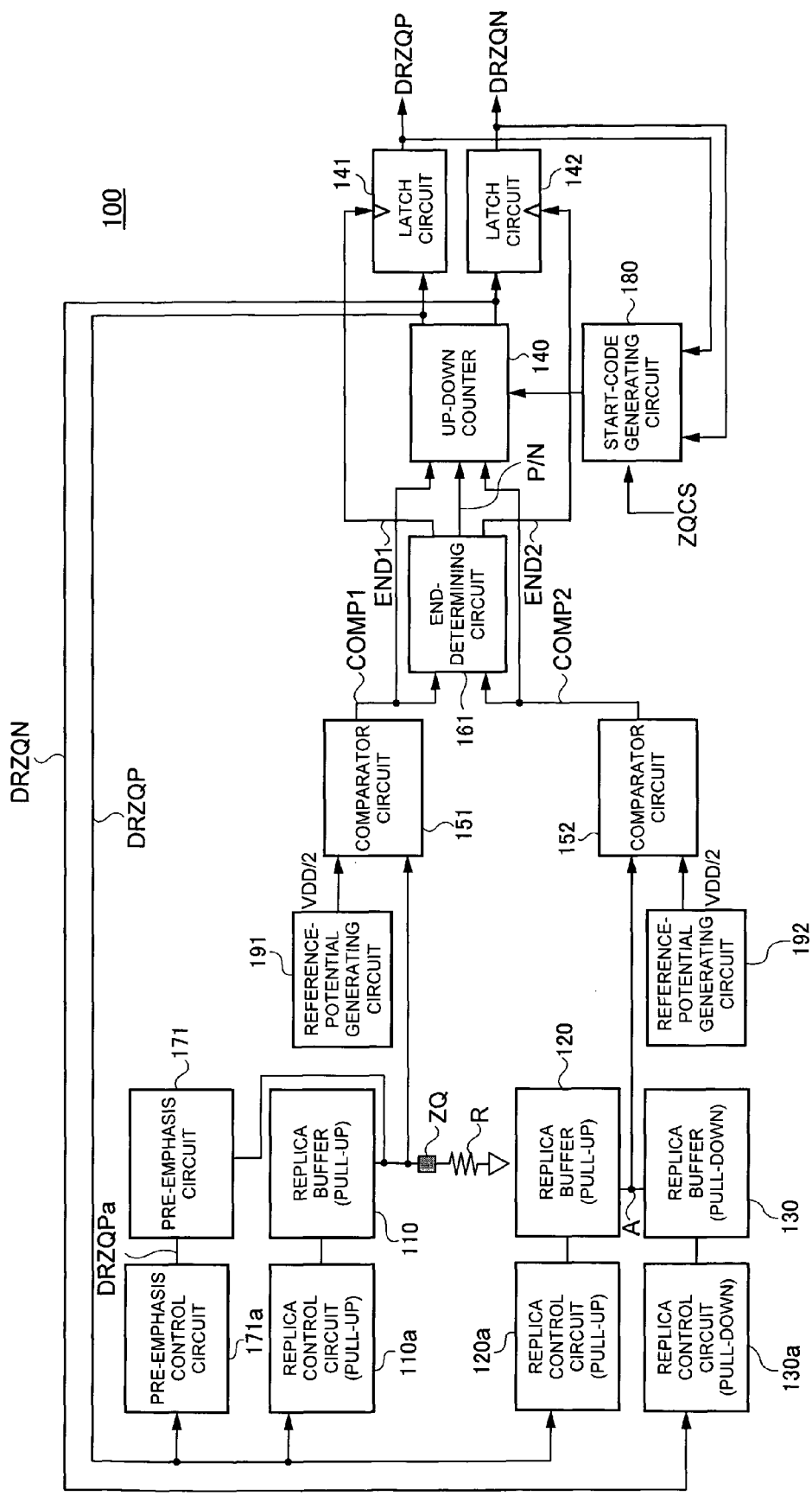
FIG. 1 is a circuit diagram of a calibration circuit according to a first preferred embodiment of the present invention.

FIG. 1 is a circuit diagram of a calibration circuit 100 according to a first preferred embodiment of the present invention.

As shown in FIG. 1, the calibration circuit 100 of the present embodiment includes replica buffers 110, 120, and 130, and control unit for controlling the impedances of the replica buffers 110, 120 and 130. The control unit includes an up-down counter 140 and latch circuits 141 and 142 for temporarily storing impedance codes generated by the up-down counter 140.

The replica buffers 110, 120, and 130 have the same circuit configuration as a part of an output buffer which will be described later. The output impedance is adjusted by using the replica buffers 110, 120, and 130 and the result is reflected in the output buffer. The impedance of the output buffer is thus set to the desired value. That is the function of the calibration circuit 100.

The calibration circuit 100 further includes a pre-emphasis circuit 171 connected in parallel to the replica buffer 110. As described later, the pre-emphasis circuit 171 becomes active in an initial stage of a conducting period of the replica buffer 110.

Figure 2:
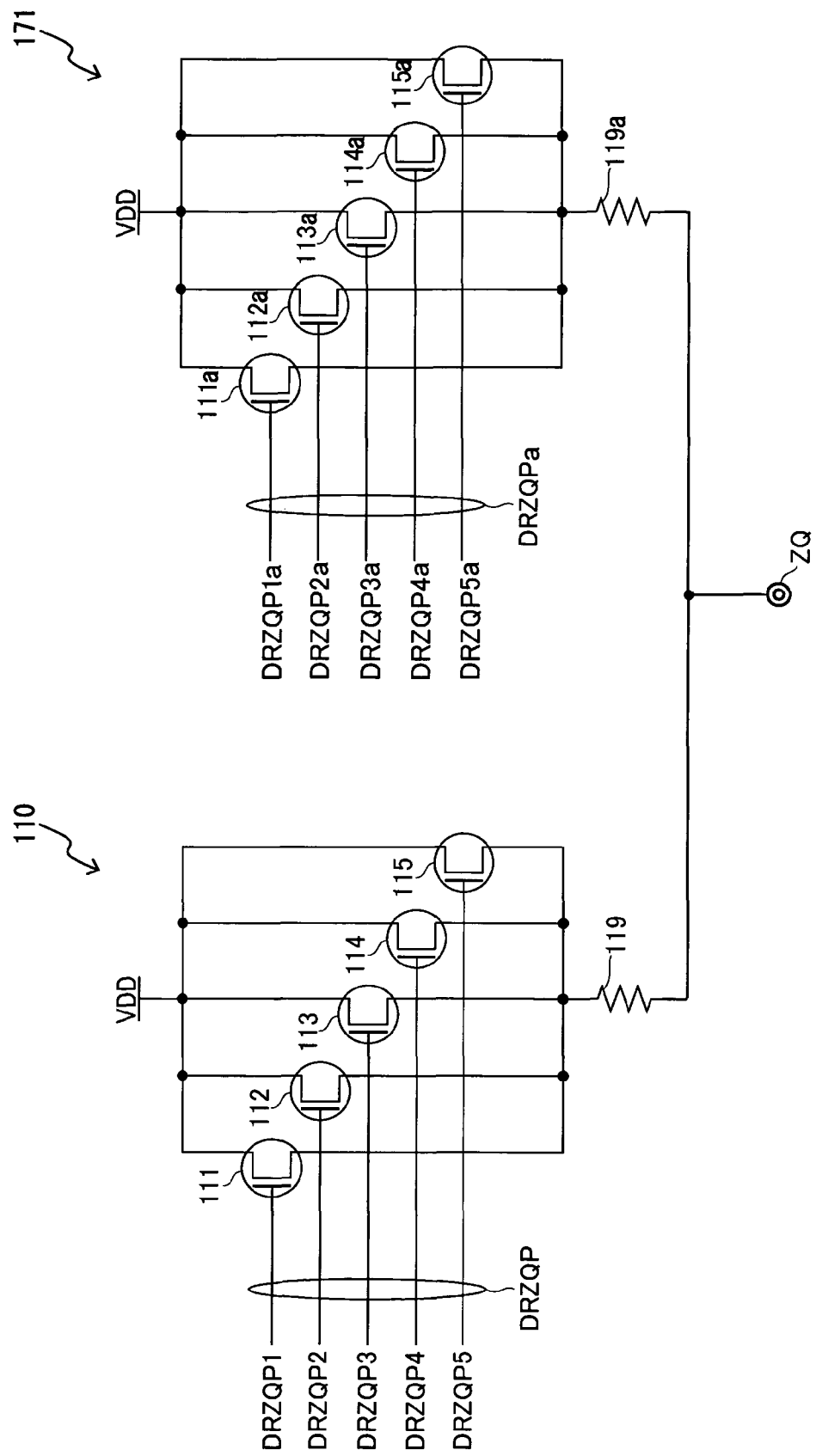
FIG. 2 is a circuit diagram of the replica buffer 110 and the pre-emphasis circuit 171.

FIG. 2 is a circuit diagram of the replica buffer 110 and the pre-emphasis circuit 171.

As shown in FIG. 2, the replica buffer 110 and the pre-emphasis circuit 171 are connected in parallel between power supply potentials VDD and a calibration terminal ZQ.

The replica buffer 110 is configured by: five p-channel MOS transistors 111 to 115 connected in parallel to the power supply potential VDD; and a resistance 119 of which the one end is connected to drains of the transistors 111 to 115. Similarly, the pre-emphasis circuit 171 is configured by: five p-channel MOS transistors 111a to 115a connected in parallel to the power supply potential VDD; and a resistance 119a of which the one end is connected to drains of the transistors 111a to 115a. The other ends of the resistances 119 and 119a are connected to the calibration terminal ZQ. The replica buffer 110 and the pre-emphasis circuit 171 have a pull-up function only, and do not have a pull-down function.

Gate electrodes of the transistors 111 to 115 are each supplied with impedance codes DRZQP1 to DRZQP5 via a replica control circuit 110a arranged before the replica buffer 110. Thereby, the five transistors included in the replica buffer 110 can individually perform ON/OFF control. Similarly, gates of the transistors 111a to 115a are each supplied with impedance codes DRZQP1a to DRZQP5a via a pre-emphasis control circuit 171a arranged before the pre-emphasis circuit 171. Thereby, also the five transistors included in the pre-emphasis circuit 171 can individually perform ON/Off control.

In FIGS. 1 and 2, the impedance codes DRZQP1 to DRZQP5 are collectively written as DRZQP, and the impedance codes DRZQP1a to DRZQP5a are collectively written as DRZQPa. The impedance code DRZQP and the impedance code DRZQPa always have the same value, and as described later, activation periods differ each other.

The replica control circuit 110a adjusts a through rate or the like of the impedance codes DRZQP1 to DRZQP5. The same applies to replica control circuits 120a and 130a described later. On the other hand, the pre-emphasis control circuit 171a causes the impedance code DRZQPa to become active when the impedance code DRZQP is in an initial stage of an activation period.

The parallel circuit of the transistors 111 to 115 included in the replica buffer 110 is designed so as to have predetermined impedance (e.g., 120Ω) in active state. However, because the on-resistance of the transistor varies depending on manufacturing conditions, environmental temperatures, and power source voltages during the operation, the desired impedance may not be obtained. To accomplish 120Ω of the impedance actually, the number of transistors to be turned on must be adjusted. The parallel circuit of a plurality of transistors is thus utilized.

To adjust the impedance closely over a wide range, W/L ratios (ratios of gate width to gate length) of the plurality of transistors constituting the parallel circuit are preferably different from one another. More preferably, a power of two weighting is performed upon the transistors. In view of this point, according to the present embodiment, when the W/L ratio of the transistor 111 is set to "1", the W/L ratios of the transistors 112 to 115 are "2", "4", "8", and "16", respectively (these W/L ratios do not represent actual W/L ratios but relative values, which will also apply to the following description.).

By selecting appropriately transistors to be turned on by the impedance codes DRZQP1 to DRZQP5, the on resistance of the parallel circuit is fixed to about 120Ω regardless of variations in the manufacturing conditions and the temperature changes.

The resistance value of the resistor 119 is designed to be 120Ω, for example. Therefore, when the parallel circuits of the transistors 111 to 115 are turned on, the impedance of the replica buffer 110 is 240Ω as seen from the calibration terminal ZQ. For example, a tungsten (W) resistor is utilized for the resistor 119.

Although not particularly limited, an impedance of a parallel circuit formed of the transistors 111a to 115a included in the pre-emphasis circuit 171 is so designed to achieve about 0.1 to 2 times that of the replica buffer 110 during an active state. Other points are the same as those of the replica buffer 110. The reason for the design is that when it is less than 0.1 times, an effect of the pre-emphasis circuit 171 cannot probably be obtained sufficiently, and when it exceeds 2 times, a chip area can probably increase unnecessarily.

Figure 3:
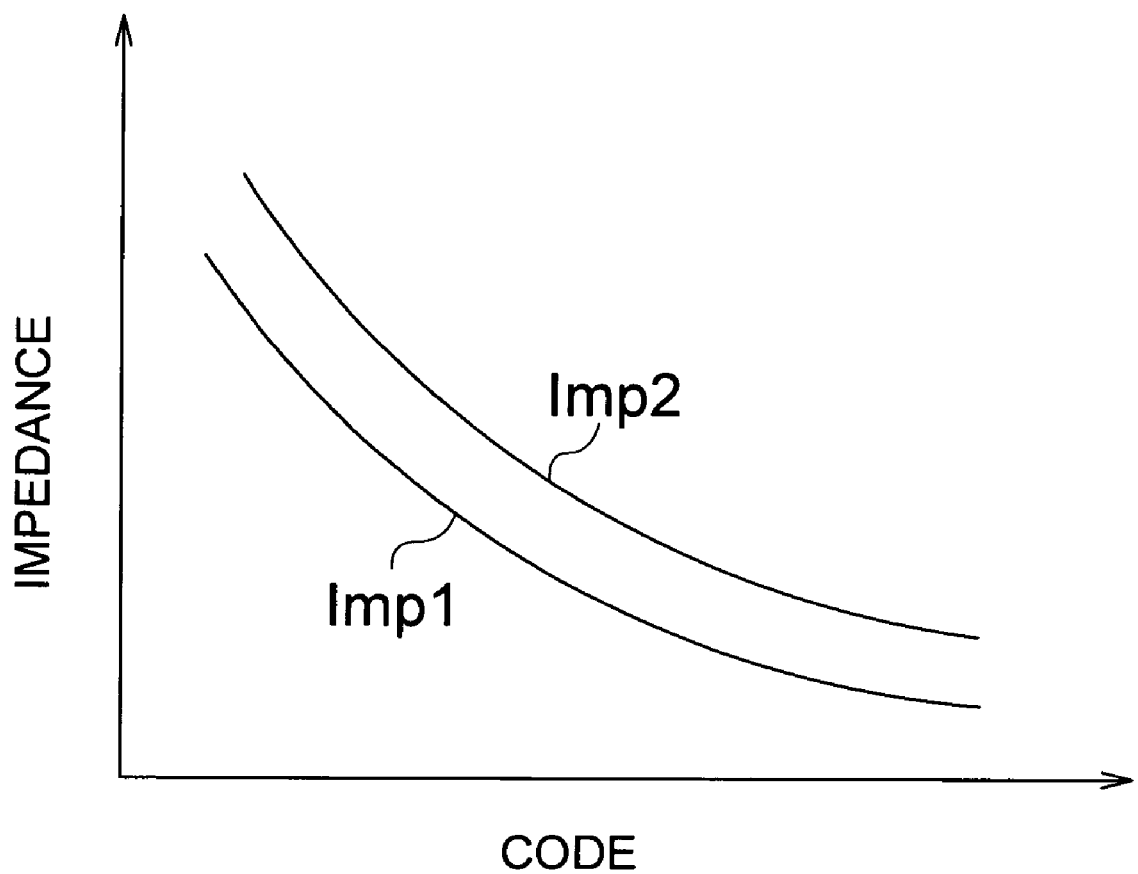
FIG. 3 is a schematic graph showing a relationship between the impedance codes DRZQP and DRZQPa and the impedance obtained.

FIG. 3 is a schematic graph showing a relationship between the impedance codes DRZQP and DRZQPa and the impedance obtained.

An impedance curve Imp1 shown in FIG. 3 is a characteristic obtained when the replica buffer 110 is activated. As shown in FIG. 3, the impedance curve Imp1 of the replica buffer 110 changes continuously corresponding to a value of the impedance code DRZQP. An impedance curve Imp2 is a characteristic obtained when the pre-emphasis circuit 171 is activated. As shown in FIG. 3, the impedance curve Imp2 of the pre-emphasis circuit 171 changes in sequence with the impedance Imp1 of the replica buffer 110.

The replica buffer 120 has the same circuit configuration as the replica buffer 110 shown in FIG. 2 except that the other end of the resistor 119 is connected to a node A. Therefore, the impedance codes DRZQP1 to DRZQP5 are provided to the gates of five transistors in the replica buffer 120 via the replica control circuit 120a.

Figure 4:
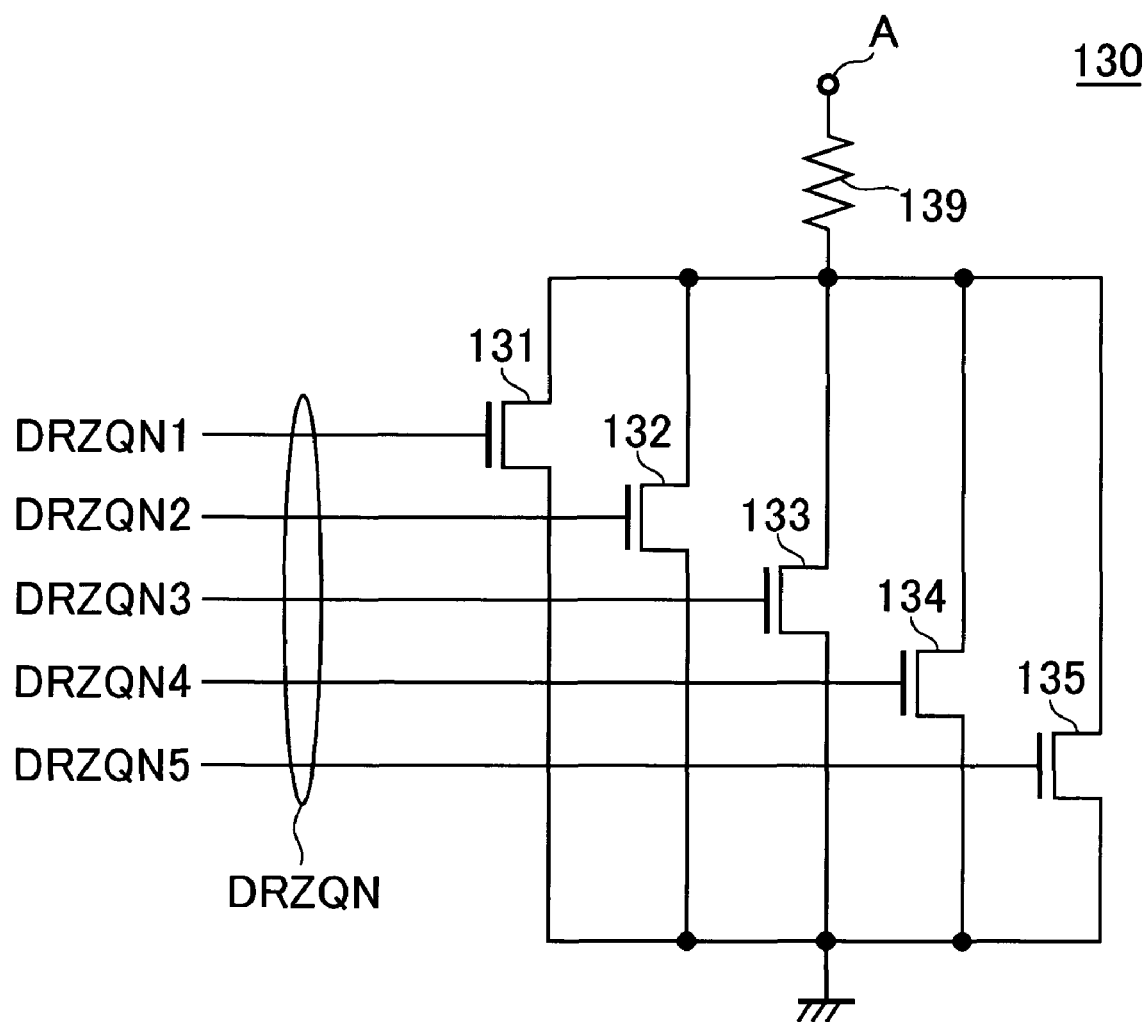
FIG. 4 is a circuit diagram of the replica buffer 130.

FIG. 4 is a circuit diagram of the replica buffer 130.

As shown in FIG. 4, the replica buffer 130 is formed by five N-channel MOS transistors 131 to 135 connected in parallel to a ground potential and a resistor 139 with its one end being connected to the drains of the transistors. The other end of the resistor 139 is connected to the node A. The replica buffer 130 does not have the pull-up function. Instead, this buffer has only the pull-down function.

Impedance codes DRZQN1 to DRZQN5 are supplied to the gate electrodes of the transistors 131 to 135, respectively. The impedance codes DRZQN1 to DRZQN5 are provided via a replica control circuit 130a provided at a former stage of the replica buffer 130. Therefore, five transistors in the replica buffer 130 can perform on-off operation separately. In FIGS. 1 and 4, the impedance codes DRZQN1 to DRZQN5 are collectively referred to as DRZQN.

The parallel circuit of the transistors 131 to 135 is designed to have e.g., 120Ω at the time of conduction. The resistance value of the resistor 139 is designed to be e.g., 120Ω. When the parallel circuit of the transistors 131 to 135 is turned on, the impedance of the replica buffer 130 is, as seen from the node A, 240Ω like the replica buffers 110 and 120.

More preferably, like the transistors 111 to 115, the power of two weighting is performed upon the W/L ratios of the transistors 131 to 135. Specifically, when the W/L ratio of the transistor 131 is "1", the W/L ratios of the transistors 132 to 135 are set to "2", "4", "8", and "16", respectively.

Returning back to FIG. 1, the up-down counter 140 is a counter circuit capable of individually counting up and counting down the impedance codes DRZQP and DRZQN. That is, the up-down counter 140 has a first operation mode of counting the impedance code DRZQP and a second operation mode of counting the impedance code DRZQN. The switching between the first and second operation modes is controlled by a switching signal P/N outputted from an end-determining circuit 161.

The impedance code DRZQP is counted up and counted down based on a comparison signal COMP1. The impedance code DRZQN is counted up and counted down based on a comparison signal COMP2.

The comparison signal COMP1 is generated by a comparator circuit 151. The comparator circuit 151 compares a potential of the calibration terminal ZQ and a reference potential (VDD/2), and controls the up-down counter 140. More specifically, when the potential of the calibration terminal ZQ is higher than the reference potential, the comparator circuit 151 counts down the impedance code DRZQP so as to increase the impedance of the replica buffer 110. On the contrary, when the potential of the calibration terminal ZQ is lower than the reference potential, the comparator circuit 151 counts up the impedance code DRZQP so as to decrease the impedance of the replica buffer 110. The reference potential supplied to the comparator circuit 151 is generated by a reference-potential generating circuit 191.

The comparison signal COMP2 is generated by a comparator circuit 152. The comparator circuit 152 compares a potential of a contact node A and the reference potential (VDD/2), and controls the up-down counter 140. The contact node A is a node between the replica buffer 120 and the replica buffer 130. More specifically, when the potential of the contact node A is higher than the reference potential, the comparator circuit 152 counts up the impedance code DRZQN so as to decrease the impedance of the replica buffer 130. On the contrary, when the potential of the contact node A is lower than the reference potential, the comparator circuit 152 counts down the impedance code DRZQN so as to increase the impedance of the replica buffer 130. The reference potential supplied to the comparator circuit 152 is generated by a reference-potential generating circuit 192.

As shown in FIG. 1, the comparison signals COMP1 and COMP2 are supplied also to an end-determining circuit 161. The end-determining circuit 161 generates an end signal END1 in response to the impedance of the replica buffer 110 reaching a predetermined level, and generates an end signal END2 in response to the impedance of the replica buffer 130 reaching a predetermined level. Whether the impedances of the replica buffers 110 and 130 reach the predetermined level is determined by referring to the comparison signals COMP1 and COMP2, respectively. As one example, when the comparison signals COMP1 and COMP2 change, it can be determined that the impedances of the replica buffers 110 and 130 reach the predetermined level. Alternatively, when the comparison signals COMP1 and COMP2 change continuously for a plurality of number of times, it can be also determined that the impedances of the replica buffers 110 and 130 reach the predetermined level. In the present invention, a determination condition of whether the impedance reaches the predetermined level is not limited in particular.

The end signals END1 and END2 are supplied to latch circuits 141 and 142, respectively. Thus, when the end signal END1 becomes active, the impedance code DRZQP counted in the up-down counter 140 is latched to the latch circuit 141. Similarly, when the end signal END2 becomes active, the impedance code DRZQN counted in the up-down counter 140 is latched to the latch circuit 142.

The calibration circuit 100 according to the first embodiment further includes a start-code generating circuit 180. The start-code generating circuit 180 supplies a start code to the up-down counter 140 in response to issuance of the calibration command ZQCS. The start code supplied to the up-down counter 140 is the impedance code held in the latch circuits 141 and 142.

Thus, a configuration of the calibration circuit 100 is described. When the calibration circuit 100 is operated actually, an external resistor 119 is connected to the calibration terminal ZQ, as shown in FIG. 1. A certain parasitic capacitance appears at the calibration terminal ZQ. When a single external resistor 119 is used in common to the plural semiconductor device, the parasitic capacitance therefore increases.

An operation of the calibration circuit 100 is explained next.

Figure 5:
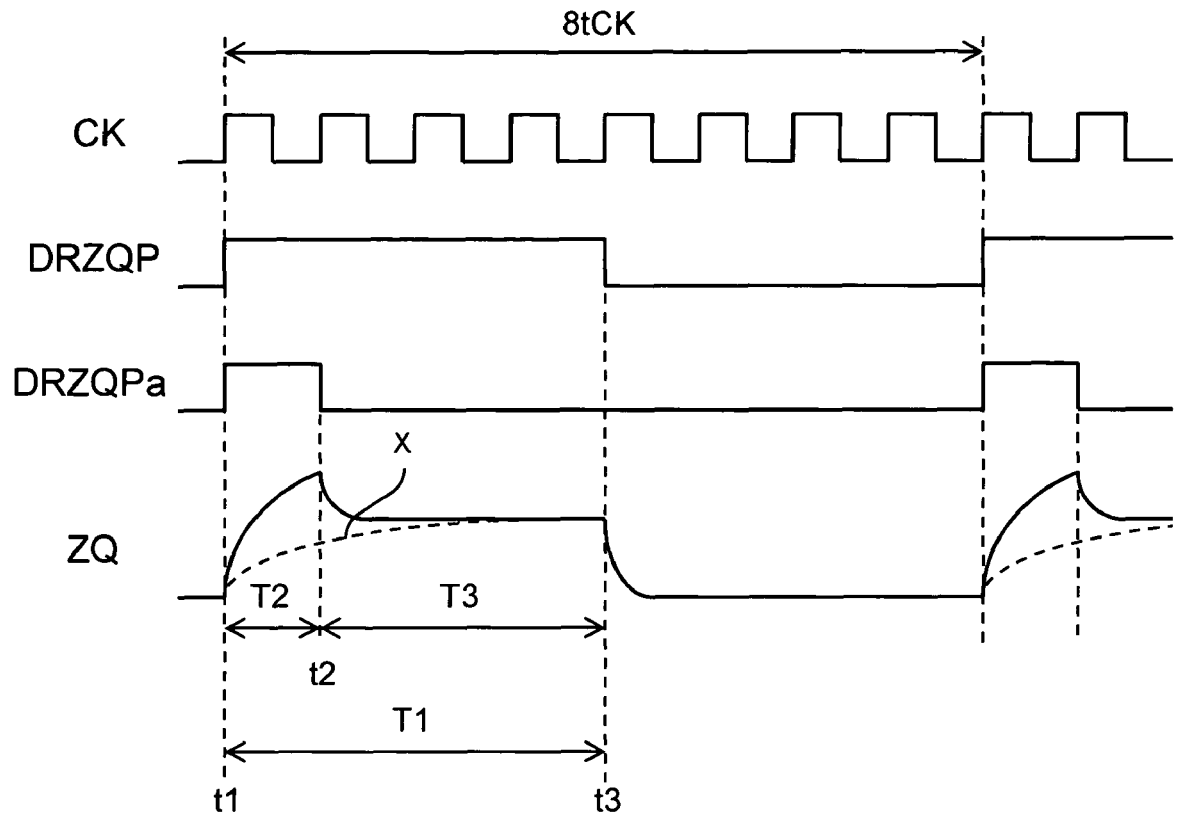
FIG. 5 is a timing chart for explaining the activation periods of the impedance codes DRZQP and DRZQPa, and a potential change of the calibration terminal ZQ in one adjusting step.

FIG. 5 is a timing chart for explaining the activation periods of the impedance codes DRZQP and DRZQPa, and a potential change of the calibration terminal ZQ in one adjusting step.

As shown in FIG. 5, in the first embodiment, one adjusting step is executed in a period of eight cycles (=8 tCK) of the external clock CK. The reason for this is that one adjusting step requires a code updating period, a comparator responding time, a determining time or the like, and when a frequency of the external clock CK is high, it is not possible to execute the adjusting step at each time the external clock CK becomes active.

In one adjusting step, the impedance code DRZQP becomes active only in a period T1 between times t1 to t3, and the impedance code DRZQPa becomes active only in a period T2 between times t1 and t2. Accordingly, the replica buffer 110 becomes conductive in the period T1, and the pre-emphasis circuit 171 becomes conductive in the period T2.

Thus, in the period T2 between the times t1 and t2, also the pre-emphasis circuit 171 becomes conductive simultaneously, and thus, the calibration terminal ZQ is pulled up with a higher drive capability as compared to a case that the replica buffer 110 alone is turned on. As a result, the potential of the calibration terminal ZQ rapidly rises.

Thereafter, when a period T3 between times t2 and t3 is arrived, the pre-emphasis circuit 171 becomes turned off, and the calibration terminal ZQ is driven by the replica buffer 110 only. Accordingly, the potential of the calibration terminal ZQ reaches a predetermined value determined by the impedance of the replica buffer 110.

In FIG. 5, a potential change of the calibration terminal ZQ when the pre-emphasis circuit 171 is not used is indicated by a dotted line X. As indicated by the dotted line X, when the pre-emphasis circuit 171 is not used, it requires a significant amount of time before the potential of the calibration terminal ZQ reaches the predetermined value. Particularly, when one external resistor R is shared among a plurality of semiconductor devices, a parasitic capacitance added to the calibration terminal ZQ is large, and thus, a longer time is required.

On the contrary, in the first embodiment, the pre-emphasis circuit 171 is activated in an initial stage of a conducting period of the replica buffer 110, and thus, the potential of the calibration terminal ZQ can be rapidly raised to the predetermined value.

Figure 6:
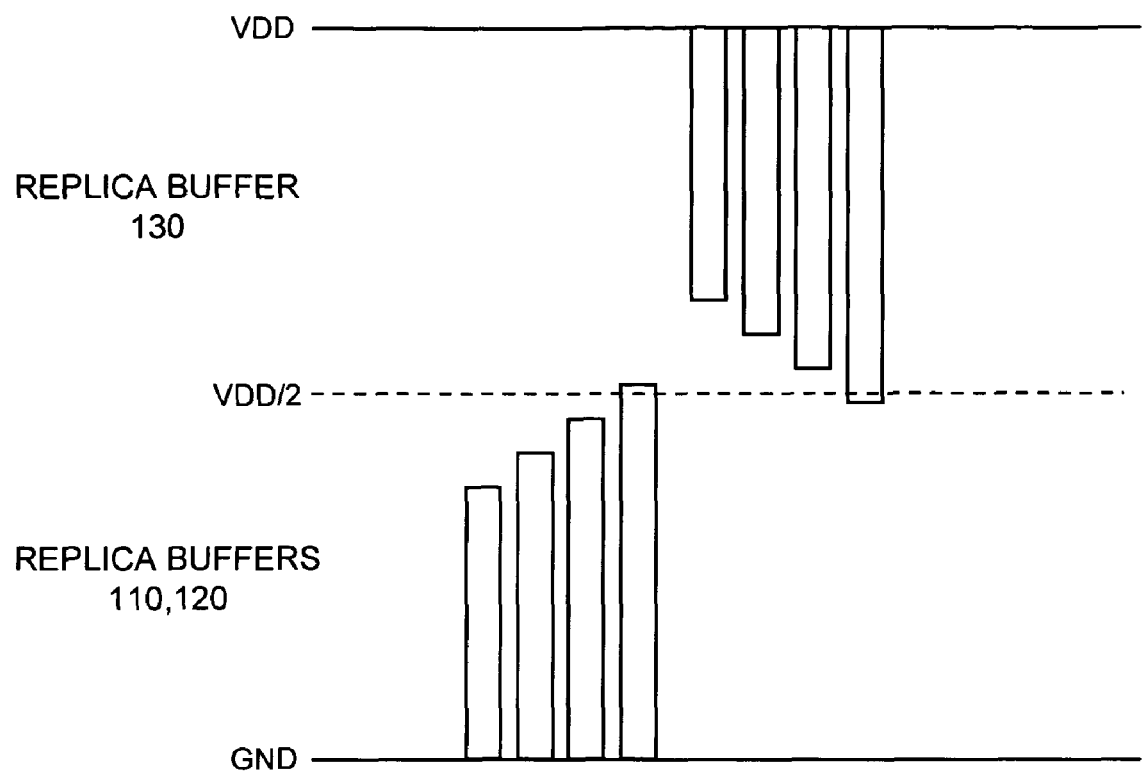
FIG. 6 is a schematic waveform chart showing one example of an output change of the replica buffer during the calibration operation.

FIG. 6 is a schematic waveform chart showing one example of an output change of the replica buffer during the calibration operation.

An example shown in FIG. 6 shows a case that the impedances of the replica buffers 110, 120, and 130 are higher than a target value, and thus, the potential of the calibration terminal ZQ is lower than a reference potential (=VDD/2) or target value and the potential of the contact node A is higher than the reference potential.

When the calibration command is issued, the start-code generating circuit 180 supplies the up-down counter 140 with the impedance code DRZQP held in the latch circuit 141. Upon issuance of the calibration command, in the up-down counter 140, a first operation mode of counting up or counting down the impedance code DRZQP is selected, and thereby, a content of the latch circuit 141 is fetched as the impedance code DRZQP.

The comparator circuit 151 is then used to compare the potential of the calibration terminal ZQ and the reference potential, and according to a result thereof, the impedance code DRZQP is counted up or counted down by the up-down counter 140. In this example shown in FIG. 6, the impedance of the replica buffer 110 is high, so that the potential of the calibration terminal ZQ is lower than the reference potential. Thus, the impedance code DRZQP is counted up. As a result, the impedance of the replica buffer 110 is decreased by one step, and also the potential of the calibration terminal ZQ is increased by one step.

Such operations are executed for a plurality of cycles (four cycles in this example shown in FIG. 6), and when the potential of the calibration terminal ZQ reaches the reference potential VDD/2, the end determining circuit 161 generates an end signal END1. In response thereto, the latch circuit 141 latches the current impedance code DRZQP. Further, the end determining circuit 161 brings a switching signal P/N into an active state. In response thereto, the operation modes of the up-down counter 140 are switched, and thereby, a second operation mode of counting up or counting down the impedance code DRZQN is established. The start-code generating circuit 180 supplies the up-down counter 140 with the impedance code DRZQN held in the latch circuit 142. As a result, a content of the latch circuit 142 is fetched in the up-down counter 140 as the impedance code DRZQN.

Thereafter, the comparator circuit 152 is used to compare the potential of the contact node A and the reference potential, and according to a result thereof, the impedance code DRZQN is counted up or counted down by the up-down counter 140. In this example shown in FIG. 6, the impedance of the replica buffer 130 is high, and thus, the potential of the contact node A is higher than the reference potential. Accordingly, the impedance code DRZQN is counted up. As a result, the impedance of the replica buffer 130 is decreased by one step, and the potential of the contact node A also is decreased by one step.

Such operations are executed for a plurality of cycles (four cycles in this example shown in FIG. 6), and when the potential of the contact node A reaches the reference potential VDD/2, the end determining circuit 161 generates an end signal END2. In response thereto, the latch circuit 142 latches the current impedance code DRZQN.

As a result of these operations, the impedances of the replica buffers 110, 120, and 130 are adjusted to a desired value (120Ω, for example). The impedance codes DRZQP and DRZQN latched to the latch circuits 141 and 142 are used for an impedance adjustment of an output buffer described later.

As described above, the calibration circuit 100 includes the pre-emphasis circuit 171, and thus, the potential of the calibration terminal ZQ can be rapidly pulled up. Thus, even when one external resistor R is shared among a plurality of semiconductor devices, the calibration operation can be performed at a high speed.

Figure 7:
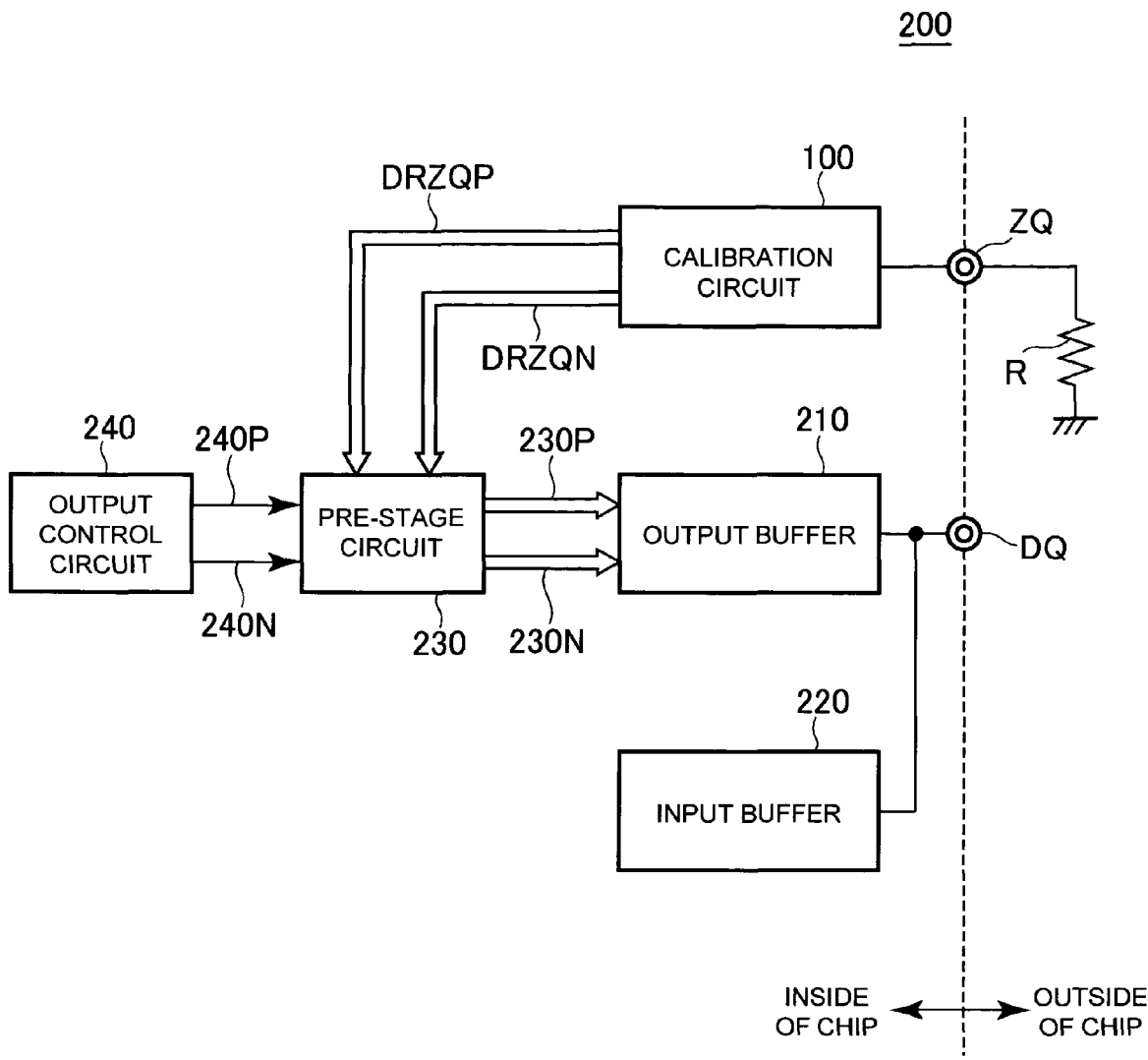
FIG. 7 is a block diagram of main parts of a semiconductor device 200 that includes the calibration circuit 100.

FIG. 7 is a block diagram of main parts of a semiconductor device 200 that includes the calibration circuit 100.

The semiconductor device 200 shown in FIG. 7 includes, in addition to the calibration circuit 100, an output buffer 210 and input buffer 220 that are connected to a data input/output terminal DQ. Since the configuration of the input buffer 220 is not directly relevant to the scope of the present invention, its description will be omitted in the specification.

The operation of the output buffer 210 is controlled by operation signals 230P and 230N provided from a pre-stage circuit 230. As shown in FIG. 7, the impedance codes DRZQP and DRZQN provided from the calibration circuit 100 are provided to the pre-stage circuit 230.

Figure 8:
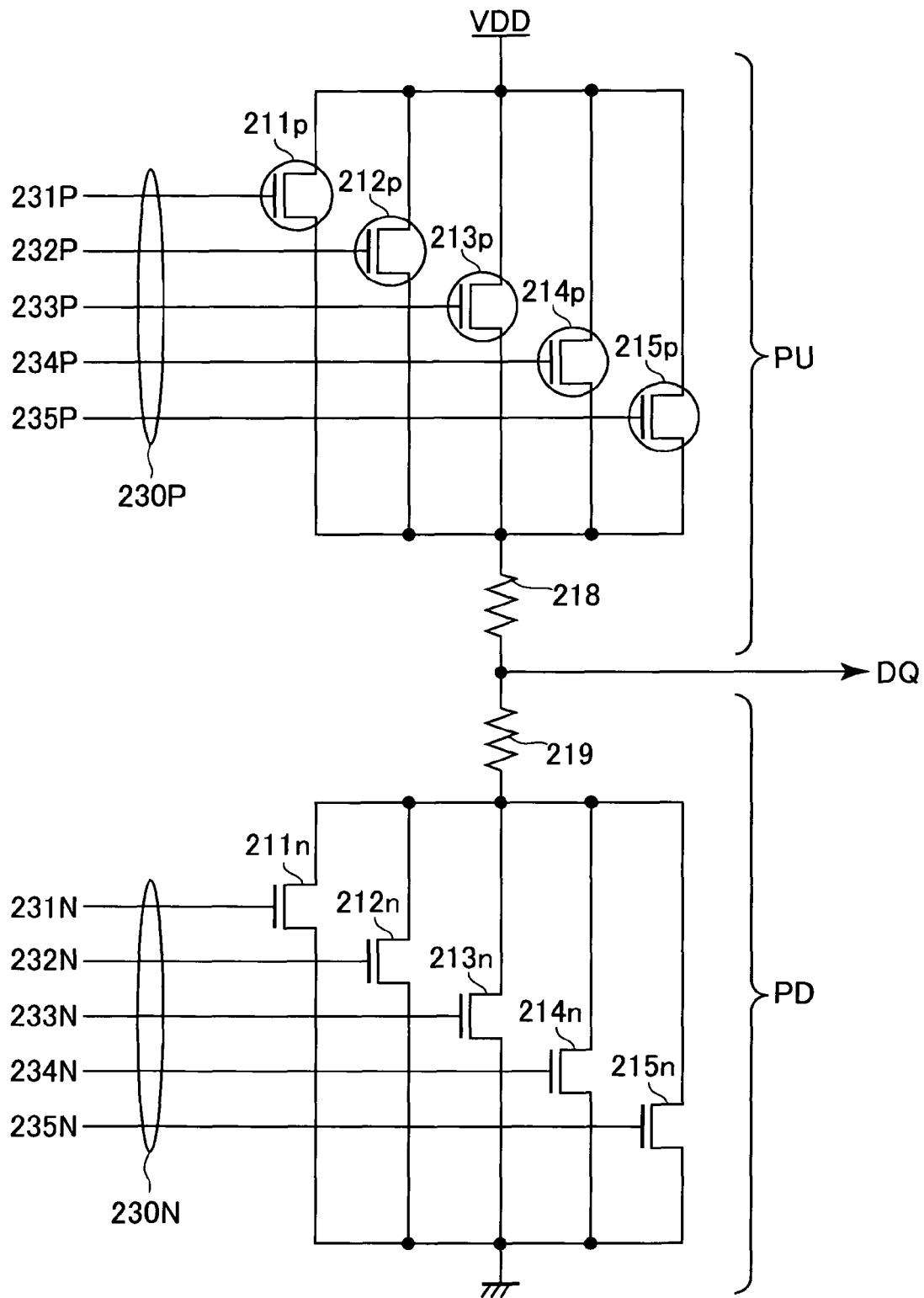
FIG. 8 is a circuit diagram of the output buffer 210.

FIG. 8 is a circuit diagram of the output buffer 210.

As shown in FIG. 8, the output buffer 210 includes five P-channel MOS transistors 211p to 215p connected in parallel and five N-channel MOS transistors 211n to 215n connected in parallel. Resistors 218 and 219 are serially connected between the transistors 211p to 215p and the transistors 211n to 215n. The connection point of the resistor 218 and the resistor 219 is connected to the data input/output terminal DQ.

Five operation signals 231P to 235P that constitute an operation signal 230P are provided to the gates of the transistors 211p to 215p. Five operation signals 231N to 235N that constitute an operation signal 230N are provided to the gates of the transistors 211n to 215n. Ten transistors in the output buffer 210 are on-off controlled separately by ten operation signals 231P to 235P and 231N to 235N. The operation signals 231P to 235P constitute the operation signal 230P, and the operation signals 231N to 235N constitute the operation signal 230N.

In the output buffer 210, a pull-up circuit PU formed by the P-channel MOS transistors 211p to 215p and the resistor 218 has the same circuit configuration as the replica buffer 110 (120) shown in FIG. 2. A pull-down circuit PD formed by the N-channel MOS transistors 211n to 215n and the resistor 219 has the same circuit configuration as the replica buffer 130 shown in FIG. 4.

Accordingly, the parallel circuit of the transistors 211p to 215p and the parallel circuit of the transistors 211n to 215n are designed to have e.g., 120Ω at the time of conduction. Resistance values of the resistors 218 and 219 are designed to be, e.g., 120Ω, respectively. Therefore, if either the parallel circuit of the transistors 211p to 215p or the parallel circuit of the transistors 211n to 215n is turned on, the impedance of the output buffer is 240Ω as seen from the data input/output terminal DQ.

In actual semiconductor devices, a plurality of these output buffers 210 are provided in parallel and the output impedance is selected depending on the number of output buffers to be used. Assume that the impedance of the output buffer is indicated by X, by using Y output buffers in parallel, the output impedance is calculated as X/Y.

Figure 9:
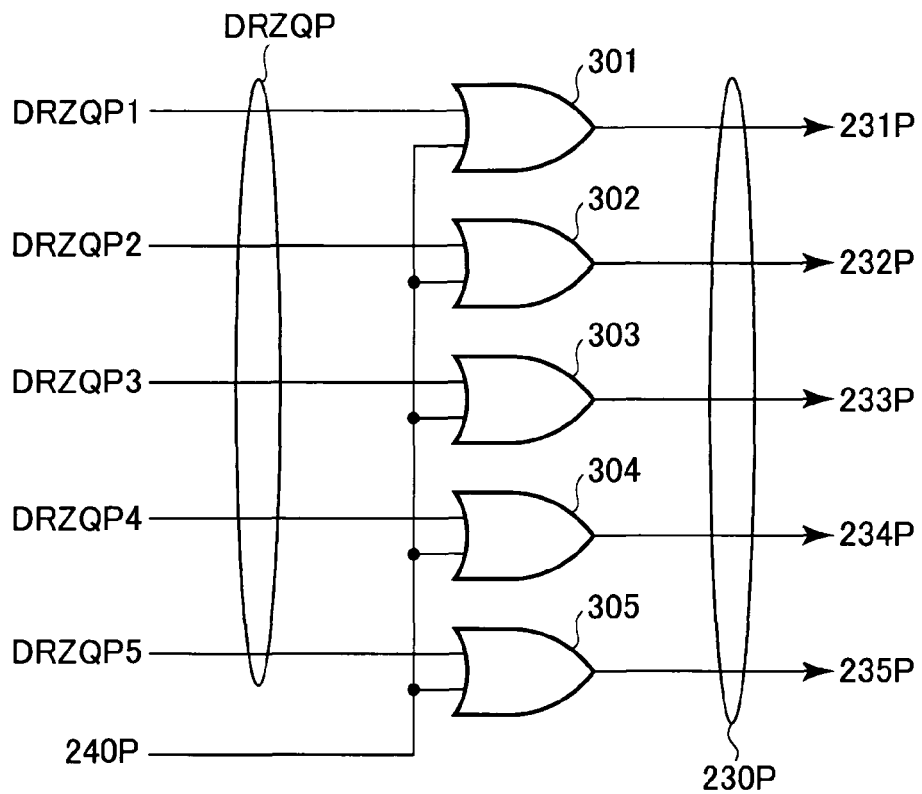
FIG. 9 is a circuit diagram of the pre-stage circuit 230.
Figure 9:
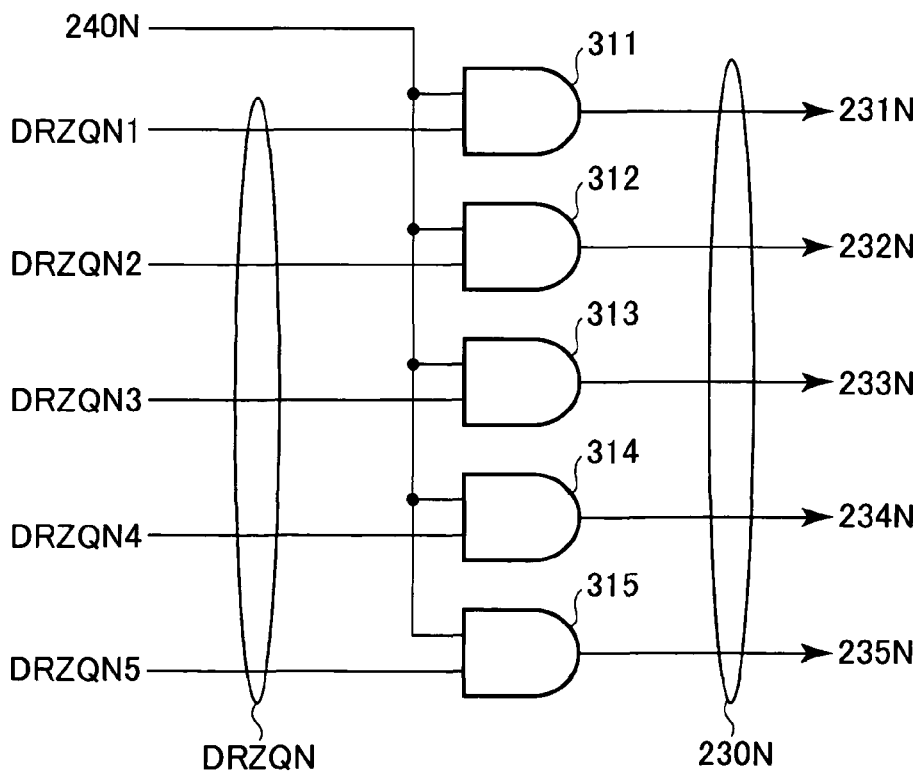

FIG. 9 is a circuit diagram of the pre-stage circuit 230.

As shown in FIG. 9, the pre-stage circuit 230 is formed by five OR circuits 301 to 305 and five AND circuits 311 to 315.

A selection signal 240P from an output control circuit 240 and the impedance codes DRZQP1 to DRZQP5 from the calibration circuit 100 are provided to the OR circuits 301 to 305. Meanwhile, a selection signal 240N from the output control circuit 240 and the impedance codes DRZQN1 to DRZQN5 from the calibration circuit 100 are provided to the AND circuits 311 to 315.

The selection signals 240P and 240N that are the outputs of the output control circuit 240 are controlled depending on logic values of data to be outputted from the data input/output terminal DQ. Specifically, when a high level signal is outputted from the data input/output terminal DQ, the selection signals 240P and 240N are set to low level. When a low level signal is outputted from the data input/output terminal DQ, the selection signals 240P and 240N are set to high level. When ODT (On Die Termination) that the output buffer 210 is used as a terminal resistor is utilized, the selection signal 240P is set to low level and the selection signal 240N is set to high level.

Operation signals 231P to 235P (=230P) that are the outputs of the OR circuits 301 to 305 and the operation signals 231N to 235N (=230N) that are the outputs of the AND circuits 311 to 315 are provided to the output buffer 210 as shown in FIG. 9.

The configuration of the semiconductor device 200 has been described. With respect to the operation of the calibration circuit 100 according to the present embodiment, the output buffer 210 can operate the same impedance adjusted by the calibration circuit 100.

Figure 10:
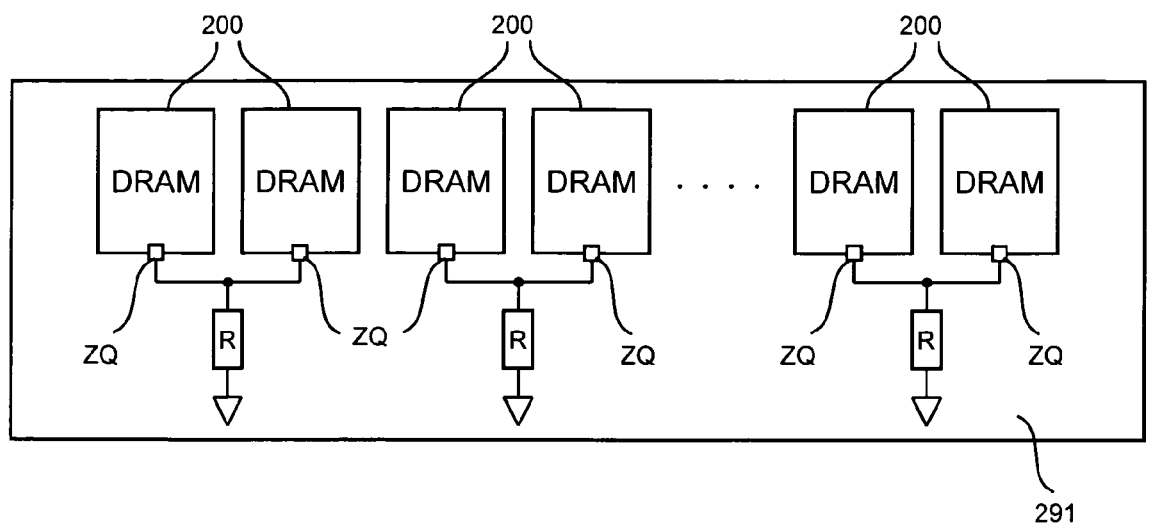
FIG. 10 is a schematic diagram showing a configuration of the memory module 290 including the semiconductor device 200.

FIG. 10 is a schematic diagram showing a configuration of the memory module 290 including the semiconductor device 200.

The memory module 290 shown in FIG. 10 includes a circuit board 291 mounted thereon with a plurality of semiconductor devices 200 and resister elements R mounted on the circuit board 291. In this example, there is shown an example where one resister element R is shared between the two semiconductor devices 200. In such a case, the parasitic capacitance appearing at the calibration terminal ZQ becomes very large. However, as described above, the calibration circuit 100 included in the semiconductor device 200 is formed with the first pre-emphasis circuit 171. Therefore, the voltage appearing in the calibration terminal ZQ can be stabilized at a high speed.

Figure 11:
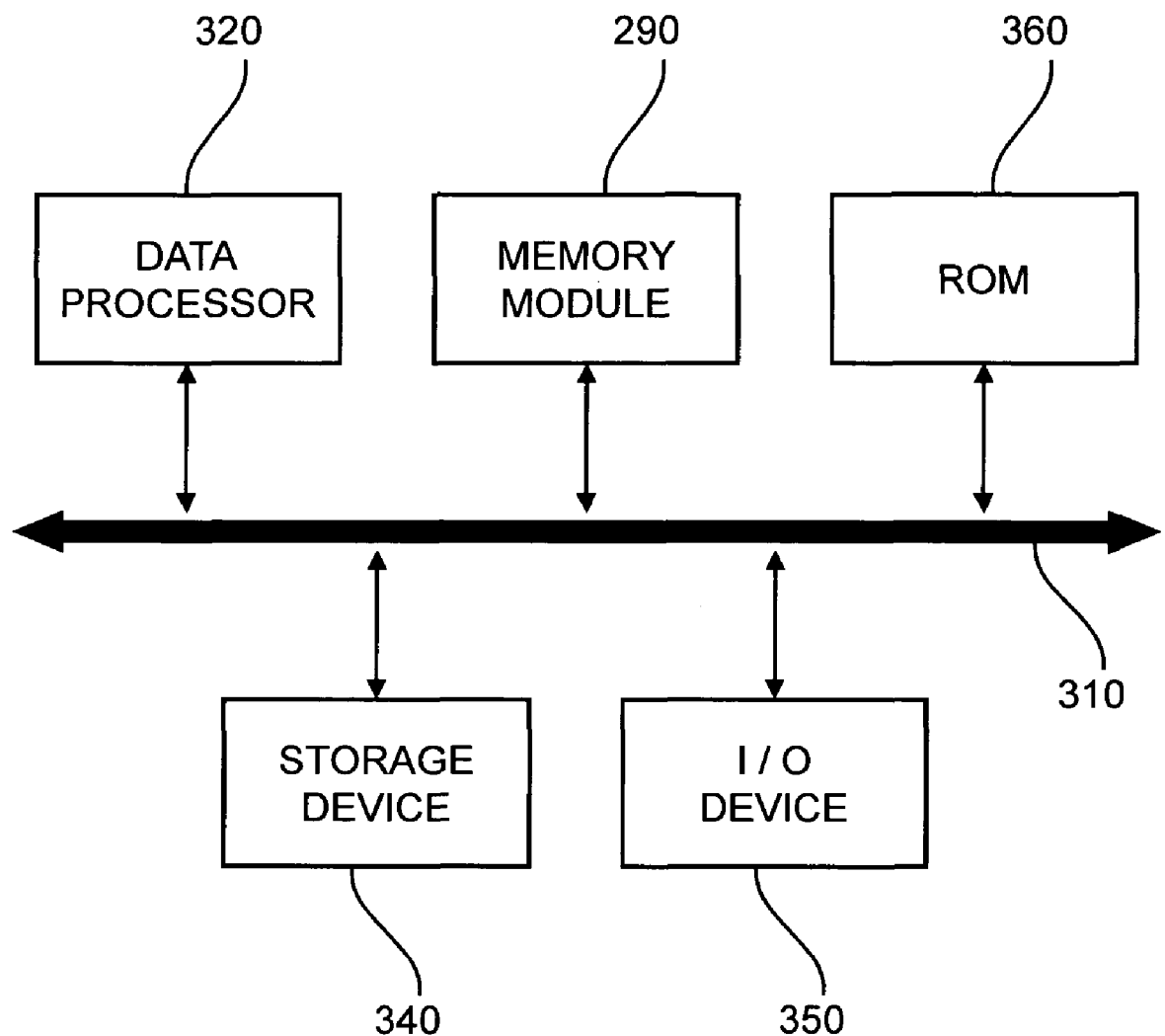
FIG. 11 is a block diagram showing a configuration of a data processing system 300 using a semiconductor memory device according to a preferred embodiment of the present invention.

FIG. 11 is a block diagram showing a configuration of a data processing system 300 using the memory module 290 according to the preferred embodiment of the present invention.

The data processing system 300 shown in FIG. 11 includes a data processor 320 and the memory module 290 of the present embodiment connected to each other via a system bus 310. The data processor 320 includes a microprocessor (MPU) and a digital signal processor (DSP), for example. However, the constituent elements of the data processor 320 are not limited to these. In FIG. 11, while the data processor 320 and the memory module 290 are connected to each other via the system bus 310, to simplify the explanation, the data processor 320 and the memory module 290 can be connected to each other via a local bus without via the system bus 310.

While only one set of the system bus 310 is drawn to simplify the explanation in FIG. 11, the system bus can be set in series or in parallel via the connector according to need. In the memory system data processing system shown in FIG. 11, a storage device 340, an I/O device 350, and a ROM 360 are connected to the system bus 310. However, these are not necessarily essential constituent elements of the invention.

The storage device 340 includes a hard disk drive, an optical disk drive, and a flash memory. The I/O device 350 includes a display device such as a liquid-crystal display, and an input device such as a keyboard and a mouse. The I/O device 350 may be any one of the input device and the output device. Further, while each one constituent element is drawn in FIG. 11 to simplify the explanation, the number of each constituent element is not limited to one, and may be one or two or more.

A second embodiment of the present invention is explained next.

Figure 12:
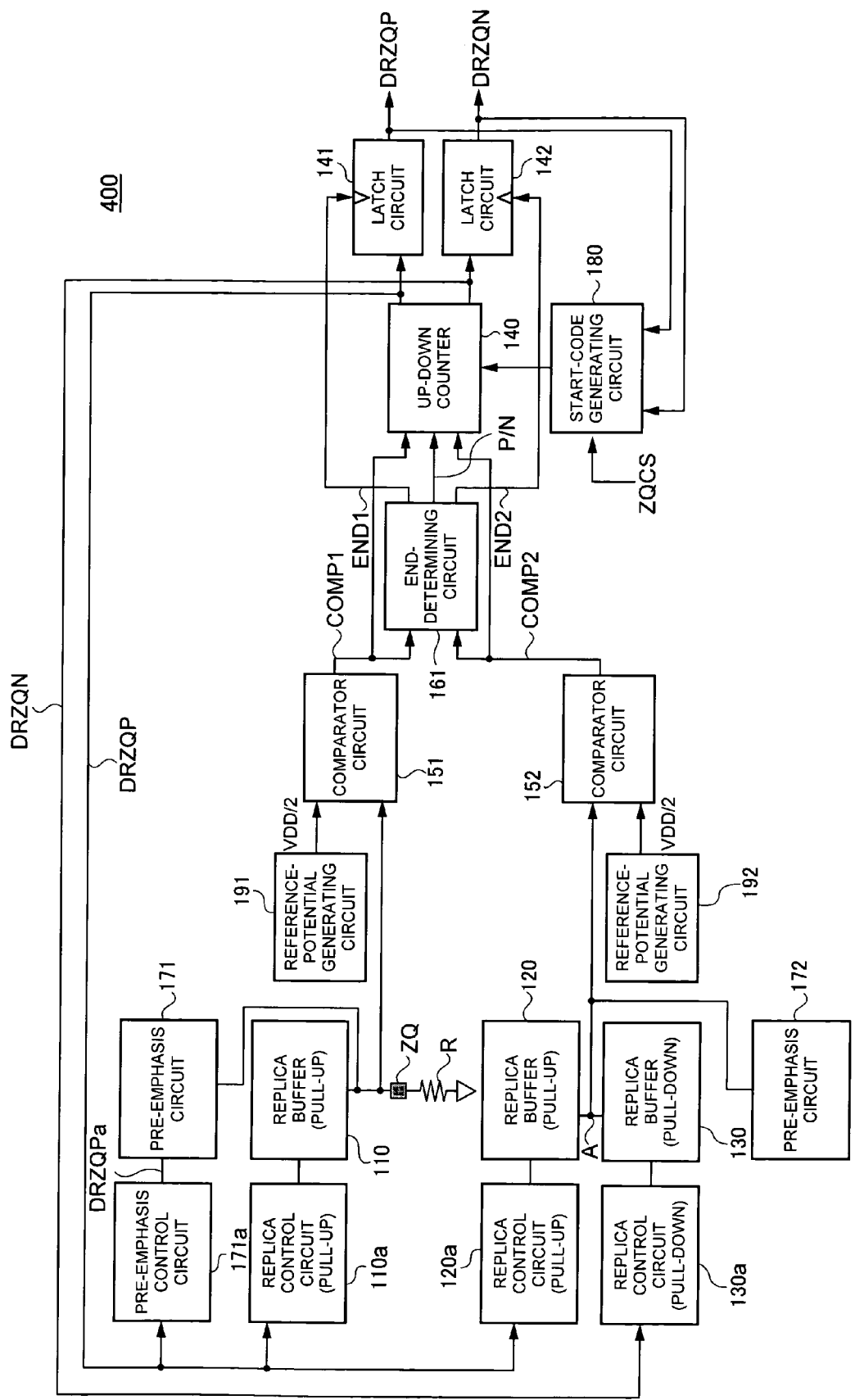
FIG. 12 is a circuit diagram of a calibration circuit 400 according to the second embodiment of the present invention.

FIG. 12 is a circuit diagram of a calibration circuit 400 according to the second embodiment.

As shown in FIG. 12, the calibration circuit 400 differs from the calibration circuit 100 shown in FIG. 1 in that a pre-emphasis circuit 172 is added. Because other features of the calibration circuit 400 are the same as those of the calibration circuit 100, like elements are denoted by like reference numerals and redundant explanations thereof will be omitted.

The pre-emphasis circuit 172 is connected in parallel to the replica buffer 130, and corresponds to the pre-emphasis circuit 171. Thus, in the second embodiment, the replica buffer 110 which is a pull-up side is connected with the pre-emphasis circuit 171, and the replica buffer 130 which is a pull-down side is connected with the pre-emphasis circuit 172. Integrities of the replica buffers 110 and 130 are higher than that of the calibration circuit 100. Thus, a more accurate calibration operation can be performed.

However, different from the pre-emphasis circuit 171, the pre-emphasis circuit 172 is not formed with the corresponding pre-emphasis control circuit. That is, the pre-emphasis circuit 172 is a dummy circuit, and thus, the pre-emphasis circuit 172 does not become conductive. The reason for this is that in the replica buffer 110, the calibration terminal ZQ connected to outside needs to be driven, but in the replica buffer 130, it suffices to drive the contact node A of which the load capacitance is small, and thus, the pre-emphasis circuit 172 does not need to be activated. Rather, when the pre-emphasis circuit 172 is activated, the potential of the contact node A undergoes overshoot during the calibration operation, and thus, the calibration operation can likely require extra time.

Thus, in the calibration circuit 400, the replica buffer 130 on the pull-down side is connected with the dummy pre-emphasis circuit 172, and thus, a more accurate calibration operation can be performed.

A third embodiment of the present invention is explained next.

Figure 13:
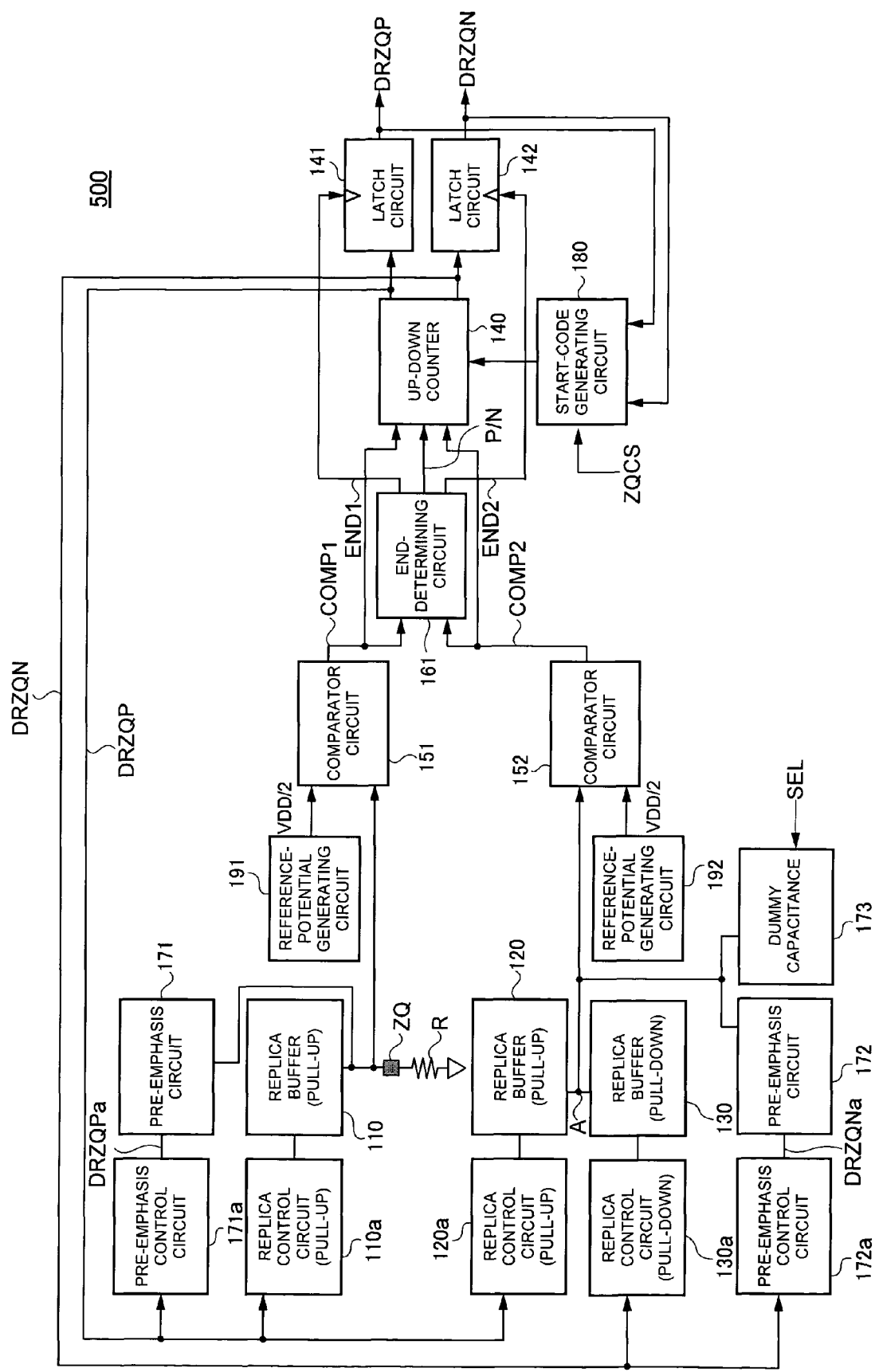
FIG. 13 is a circuit diagram of a calibration circuit 500 according to the third embodiment of the present invention.

FIG. 13 is a circuit diagram of a calibration circuit 500 according to the third embodiment.

As shown in FIG. 13, the calibration circuit 500 differs from the calibration circuit 400 shown in FIG. 12 in that a pre-emphasis control circuit 172a and a dummy capacitance 173 are added. Because other features of the calibration circuit 500 are the same as those of the calibration circuit 400, like elements are denoted by like reference numerals and redundant explanations thereof will be omitted.

The pre-emphasis control circuit 172a causes an impedance code DRZQNa to become active when the impedance code DRZQN is in an initial stage of an activation period, and corresponds to the pre-emphasis control circuit 171a. In the third embodiment, when the pre-emphasis control circuit 172a is arranged, the pre-emphasis circuit 172 becomes conductive in an initial stage of a conductive period of the replica buffer 130.

In the pre-emphasis circuit 172, similarly to the pre-emphasis circuit 171, the impedance is variable, and in response to the impedance of the replica buffer 130, also the impedance of the pre-emphasis circuit 172 changes. Thus, an influence of the pre-emphasis circuit 172 on the replica buffer 130 can be made substantially constant.

Meanwhile, the dummy capacitance 173 is connected to the contact node A. The dummy capacitance 173 has a capacitive value substantially equal to a capacitive component connected to the calibration terminal ZQ.

That is, as described in the second embodiment, when the contact node A of which the load capacitance is small is driven, if the pre-emphasis circuit 172 is activated, the overshoot is generated. However, in the third embodiment, the contact node A is connected with the dummy capacitance 173, and thus, the contact node A has the same condition as that of the calibration terminal ZQ. Thus, in the pull-down side adjustment, the pre-emphasis circuit 172 can be activated, and the pull-up side adjustment and the pull-down side adjustment can be performed on substantially the same condition.

However, the load of the calibration terminal ZQ differs depending on a mounted circuit board or the like, and thus, the load is not uniquely determined at a time of manufacturing. For example, the load of the calibration terminal ZQ greatly differs between when one external resistor R is assigned to one semiconductor device and when one external resistor R is assigned to two semiconductor devices. Taking this point into consideration, in the third embodiment, the capacitive value of the dummy capacitance 173 is variable, and can be switched by the selection signal SEL. Thereby, the actual load of the calibration terminal ZQ and the capacitive value of the dummy capacitance 173 can be made coincident ex-post facto.

The present invention is in no way limited to the aforementioned embodiments, but rather various modifications are possible within the scope of the invention as recited in the claims, and naturally these modifications are included within the scope of the invention.

For example, it is not always necessary that the size of a transistor configuring the replica buffers 110, 120, and 130 is identical to that of a transistor configuring the output buffer 210. As long as the impedance is substantially identical, a shrunk transistor can be used.

In the above embodiments, for a parallel circuit configuring the output buffer or the replica buffer, a parallel circuit is formed by five transistors. However, the number of transistors to be connected in parallel is not limited thereto.

In the above embodiments, the impedance adjustment of the replica buffer 110 on the pull-up side is firstly performed, and thereafter, the impedance adjustment of the replica buffer 130 on the pull-down side is performed using the impedance of the replica buffer 120 as a reference. However, in the present invention, the order is not particularly limited, and the impedance adjustment can be performed from the pull-down side.

In the above embodiments, in the replica buffer 110 on the pull-up side, the impedance adjustment is performed using the external resistor as a reference, and in the replica buffer 130 on the pull-down side, the impedance adjustment is performed using the replica buffer 120 as a reference. However, the present invention is not limited thereto. For example, it is also possible to adopt a system in which both on the pull-up side and the pull-down side, the impedance adjustment is performed using the external resistor as a reference.

What is claimed is:

1. A semiconductor device comprising:
a calibration circuit, the calibration circuit comprising:
a first replica unit including a first replica buffer that drives a calibration terminal and a first replica control circuit that controls the first replica buffer;
a first pre-emphasis unit including a first pre-emphasis circuit connected in parallel to the first replica buffer and a first pre-emphasis control circuit that controls the first pre-emphasis circuit;
a second replica unit including a second replica buffer having a circuit configuration substantially identical to that of the first replica buffer and a second replica control circuit that controls the second replica buffer;
a third replica unit including a third replica buffer connected in series to the second replica buffer and a third replica control circuit that controls the third replica buffer;
a second pre-emphasis unit including a second pre-emphasis circuit connected in parallel to the third replica buffer and a second pre-emphasis control circuit that controls the second pre-emphasis circuit; and
a control unit that controls the third replica control circuit to change an impedance of the third replica buffer based on a voltage appearing at a contact node between the second replica buffer and the third replica buffer, controls the first replica control circuit to change an impedance of the first replica buffer based on a voltage appearing at least at the calibration terminal, and controls the first pre-emphasis control circuit to bring the first pre-emphasis circuit into an active state during an initial stage of an active period of the first replica buffer.

2. The semiconductor device as claimed in claim 1, wherein the second pre-emphasis circuit is held in an inactive state at least during an active period of the third replica buffer.

3. The semiconductor device as claimed in claim 1, wherein the calibration circuit further comprises a dummy capacitance connected to the contact node, and
wherein the control unit controls the second pre-emphasis control circuit to bring the second pre-emphasis circuit into an active state during an initial stage of an active period of the third replica buffer.

4. The semiconductor device as claimed in claim 3, wherein an impedance of the second pre-emphasis circuit can be controlled, and the control unit controls the second pre-emphasis control circuit to change the impedance of the second pre-emphasis circuit relative to the impedance of the third replica buffer.

5. The semiconductor device as claimed in claim 3, wherein the dummy capacitance has a capacitive value substantially equal to a capacitive component connected to the calibration terminal.

6. The semiconductor device as claimed in claim 3, wherein a capacitive value of the dummy capacitance is variable.

7. The semiconductor device as claimed in claim 1, further comprising:
a data output terminal, and an output buffer that drives the data output terminal,
wherein at least a part of the output buffer has a circuit configuration identical to that of the replica buffer.

8. The semiconductor device as claimed in claim 7, wherein an impedance of the output buffer is adjusted by the control unit.

9. A memory module comprising:
a semiconductor device having a calibration terminal;
a circuit board on which the semiconductor device is mounted; and
a resistor mounted on the circuit board and connected to the calibration terminal,
wherein the semiconductor device includes a data output terminal and an output buffer that drives the data output terminal,
wherein the calibration circuit further includes:
a first replica unit including a first replica buffer that drives a calibration terminal and a first replica control circuit that controls the first replica buffer;
a first pre-emphasis unit including a first pre-emphasis circuit connected in parallel to the first replica buffer and a first pre-emphasis control circuit that controls the first pre-emphasis circuit;
a second replica unit including a second replica buffer having a circuit configuration substantially identical to that of the first replica buffer and a second replica control circuit that controls the second replica buffer;
a third replica unit including a third replica buffer connected in series to the second replica buffer and a third replica control circuit that controls the third replica buffer;
a second pre-emphasis unit including a second pre-emphasis circuit connected in parallel to the third replica buffer and a second pre-emphasis control circuit that controls the second pre-emphasis circuit; and
a control unit that controls the third replica control circuit to change an impedance of the third replica buffer based on a voltage appearing at a contact node between the second replica buffer and the third replica buffer, controls the first replica control circuit to change an impedance of the first replica buffer based on a voltage appearing at least at the calibration terminal, and controls the first pre-emphasis control circuit to bring the first pre-emphasis circuit into an active state during an initial stage of an active period of the first replica buffer.

10. The memory module as claimed in claim 9, wherein the second pre-emphasis circuit is held in an inactive state at least during an active period of the third replica buffer.

11. The memory module as claimed in claim 9, wherein the calibration circuit further comprises a dummy capacitance connected to the contact node, and
wherein the control unit controls the second pre-emphasis control circuit to bring the second pre-emphasis circuit into an active state during an initial stage of an active period of the third replica buffer.

12. A semiconductor device comprising:
a calibration terminal;
a first replica buffer coupled to the calibration terminal;
a first pre-emphasis circuit connected to the calibration terminal; and
a control unit producing a first control signal in response to a voltage at the calibration terminal, the first control signal being supplied in common to the first replica buffer and the first pre-emphasis circuit;
the first replica buffer driving the calibration terminal in response to the first control signal, and the first pre-emphasis circuit driving the calibration terminal in response to the first control signal and stopping driving the calibration terminal while the first replica buffer is still driving the calibration terminal.

13. The semiconductor device as claimed in claim 12, wherein the first replica buffer starts driving the calibration terminal substantially simultaneously with the first pre-emphasis circuit starting driving the calibration terminal.

14. The semiconductor device as claimed in claim 12, wherein the control unit produces the first control signal in synchronism with a clock signal.

15. The semiconductor device as claimed in claim 14, wherein the first replica buffer drives the calibration terminal during a period of time that is substantially equal to a first number of cycles of the clock signal and the first pre-emphasis circuit drives the calibration terminal during a period of time that is substantially equal to a second number of cycles of the clock signal, the first number being larger than the second number.

16. The semiconductor device as claimed in claim 12, wherein the first replica buffer comprises a plurality of first transistors and the first pre-emphasis circuit comprises a plurality of transistors provided correspondingly to the first transistors, at least one of the first transistors being rendered conductive in response to the first control signal, and at least one of the second transistor, which corresponds to the at least one of the first transistors, being rendered conductive in response to the first control signal.

17. The semiconductor device as claimed in claim 12, further comprising:
an internal terminal;
a second replica buffer connected to the internal terminal, and the second replica buffer driving the internal terminal in response to the first control signal;
a third replica buffer coupled to the internal terminal; and
a second pre-emphasis circuit connected to the internal terminal;
the control unit further producing a second control signal in response to a voltage at the internal terminal, the second control signal being supplied in common to the third replica buffer and the second pre-emphasis circuit, the third replica buffer driving the internal terminal in response to the second control signal, and the second pre-emphasis circuit driving the internal terminal in response to the second control signal and stopping driving the internal terminal while the third replica buffer is still driving the internal terminal.

* * * * *